United States Patent

Min

(10) Patent No.: US 9,606,186 B2
(45) Date of Patent: Mar. 28, 2017

(54) SYSTEM FOR MANAGING A BATTERY AND METHOD THEREOF

(71) Applicants: HYUNDAI MOTOR COMPANY, Seoul (KR); KIA MOTORS CORPORATION, Seoul (KR)

(72) Inventor: Kyung In Min, Seongnam-Si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 321 days.

(21) Appl. No.: 14/556,075

(22) Filed: Nov. 28, 2014

(65) Prior Publication Data

US 2016/0069961 A1 Mar. 10, 2016

(30) Foreign Application Priority Data

Sep. 5, 2014 (KR) .................. 10-2014-0118628

(51) Int. Cl.
*H02J 7/00* (2006.01)
*G01N 27/416* (2006.01)
*G01R 31/36* (2006.01)
*G01R 31/02* (2006.01)
*G01R 31/04* (2006.01)

(52) U.S. Cl.
CPC ......... *G01R 31/362* (2013.01); *G01R 31/026* (2013.01); *G01R 31/04* (2013.01)

(58) Field of Classification Search
CPC .................................... G01R 31/362
USPC ........................... 320/132; 324/426
See application file for complete search history.

(56) References Cited

U.S. PATENT DOCUMENTS

| 8,400,116 B2 * | 3/2013 | Kim | G01R 31/362 |
| | | | 320/133 |
| 9,234,944 B2 * | 1/2016 | Lim | G01R 31/362 |
| 2014/0002095 A1 | 1/2014 | Lim | |

FOREIGN PATENT DOCUMENTS

| JP | 2004-042799 A | 2/2004 |
| JP | 2009-106027 A | 5/2009 |
| JP | 2010-186643 A | 8/2010 |
| JP | 2013-082383 A | 5/2013 |
| JP | 2013-151220 A | 8/2013 |
| KR | 10-2007-0107971 A | 11/2007 |
| KR | 10-0901559 B1 | 6/2009 |
| KR | 10-0930701 B1 | 12/2009 |
| KR | 10-2012-0096278 A | 8/2012 |
| KR | 10-1191624 B1 | 10/2012 |
| KR | 10-2013-0003367 A | 1/2013 |
| KR | 10-2014-0045208 A | 4/2014 |

* cited by examiner

*Primary Examiner* — Richard V Muralidar
(74) *Attorney, Agent, or Firm* — McDermott Will & Emery LLP

(57) ABSTRACT

A system for managing a battery may comprise: an interruption determiner configured to determine an interruption of a vehicle battery voltage; a State Of Charge (SOC) calculator configured to calculate the SOC of the vehicle battery and reset the SOC if the interruption of the battery voltage occurs; and an After Sale Service (AS) generation determiner configured to determine whether the AS of a vehicle component is performed if the interruption of the battery voltage does not occur.

11 Claims, 2 Drawing Sheets

SYSTEM FOR MANAGING A BATTERY AND METHOD THEREOF

CROSS-REFERENCE TO RELATED APPLICATION

This application is based on and claims priority to Korean Patent Application No. 10-2014-0118628, filed on Sep. 5, 2014 in the Korean Intellectual Property Office, the disclosure of which is incorporated herein in its entirety by reference.

FIELD OF THE INVENTION

The present disclosure relates to a system for managing a battery and a method thereof, and more particularly, a technology capable of accurately calculating a SOC (State Of Charge) of a vehicle battery.

BACKGROUND

Vehicles utilizing an internal combustion engine using a gasoline or heavy fuel oil as a main fuel have seriously polluted air. Accordingly, in order to reduce the pollution, great efforts are being made to develop an electric vehicle or a hybrid vehicle recently.

The electric vehicle is the vehicle using a battery engine operated by electric energy outputted from a battery. Because this electric vehicle uses the battery, in which a number of secondary batteries capable of charging and discharging are formed in a single pack, as a main power source, the electric vehicle brings great advantages such as no exhaust gases and very little noise.

On the other hand, the hybrid vehicle is the vehicle in the middle stage of the vehicle using an internal combustion engine and the electric vehicle, and uses power sources in at least two ways, for example, the internal combustion engine and the battery engine. Currently, the mixed type of hybrid vehicle which uses the internal combustion engine and a fuel cell directly obtaining electric energy by having a chemical reaction while continuously supplying hydrogen and oxygen or uses the battery and the fuel cell, etc. is being developed.

Like this, in the vehicle using the battery engine, the number of the secondary battery is increased in order to improve the power source. Since a number of connected cells directly influence the performance of the vehicle, as well as the performance of each battery cell must be superior, a battery management system (hereinafter, BMS) capable of efficiently managing the charge and discharge and the life for each of battery cells by measuring a voltage for each of battery cells, a total battery voltage and current, etc. is required.

In particular, the BMS calculates the SOC of the battery, stores it, calculates charge/discharge output which can be used to the vehicle according to the state of the battery and provides it to a vehicle controller and the like. However, due to the replacement of such a high voltage battery or the BMS, the last calculated SOC is not stored when detaching, and thus the real SOC of the battery and the SOC recognized by the battery management system will not be matched.

Like this, if the SOC of the battery is erroneously recognized, by calculating and controlling the charge/discharge output of the vehicle based on the erroneous SOC information, over-discharge or over-charge can be occurred.

SUMMARY OF THE INVENTION

An embodiment of the present inventive concept provides a technology for correcting a SOC by resetting it if the real SOC of the battery are not matched with the SOC recognized by the BMS due to the replacement of components such as the BMS or a high voltage battery and the like.

A system for managing a battery according to an embodiment of the present inventive concept may comprise: an interruption determiner configured to determine an interruption of a vehicle battery voltage; a State Of Charge (SOC) calculator configured to calculate the SOC of the vehicle battery and reset the SOC if the interruption of the battery voltage is generated; and an After Sale Service (AS) generation determiner configured to determine whether the AS of a vehicle component is proceeded if the interruption of the battery voltage is not generated.

Also, the SOC calculator may recognize a reset SOC as a real SOC of the battery by resetting the SOC if it is determined that the AS of the vehicle component is performed in the AS generation determiner, and recognize a SOC last calculated in the SOC calculator as the real SOC of the battery if the AS of the vehicle component is not performed in the AS generation determiner.

Also, the AS generation determiner may determine that the AS is performed in a state which an assistive battery is connected and resets the SOC if a soaking time is more than a predetermined time and a hardware reset is recognized.

Also, the AS generation determiner may determine that the AS is performed in a state which an assistive battery is detached and resets the SOC if a soaking time is less than a predetermined time and a hardware reset is recognized.

Also, the interruption determiner may determine that the battery voltage is interrupted if a high voltage battery is detached in a latch section after an ignition is turned off, or if the high voltage battery is detached in a state which the ignition is turned on.

Also, the AS may include a replacement of at least one component of a high voltage battery, a battery management system.

Also, the system may further comprise a storage configured to store a calculated SOC of the vehicle battery.

A method for managing a battery according to the present inventive concept may comprise steps of: determining whether an interruption of a battery voltage occurs; determining whether an AS is performed, if the interruption of the battery voltage does not occur; and resetting a State Of Charge (SOC) of the battery if the AS is performed or the interruption of the battery voltage occurs; and recognizing the reset SOC as a real SOC of the battery.

Also, the step of determining whether an AS is performed may determine that the AS is performed in a state which an assistive battery is connected if a soaking time is more than a predetermined time and a hardware reset is recognized.

Also, the step of determining whether an AS is performed may determine that the AS is performed in a state which an assistive battery is detached if a soaking time is less than a predetermined time and a hardware reset is recognized.

Also, the step of determining may determine that the battery voltage is interrupted if a high voltage battery is detached in a latch section after an ignition is turned off, or if the high voltage battery is detached in a state which the ignition is turned on.

The present technology has the effect capable of optimally controlling the battery by correcting the SOC by resetting it and accordingly recognizing the accurate SOC of the real battery when the system for managing a batter is erroneously operated or its component is replaced.

BRIEF DESCRIPTION OF THE DRAWINGS

The above and other objects, features and advantages of the present inventive concept will be more apparent from the following detailed description taken in conjunction with the accompanying drawings, in which.

DETAILED DESCRIPTION OF THE PREFERRED EMBODIMENTS

Hereinafter, in order to explain in detail to the extent that the ordinary skilled in the art can easily embody the technical concept of the present invention, the most preferred embodiment of the present invention will be described with reference to the accompanying drawings.

The present inventive concept recognizes the case that the real SOC (State of Charge) of the battery are not matched with the SOC recognized by the battery management system (BMS), and matches the real SOC of the battery and the SOC recognized by the BMS, so that the over-discharge or over-charge of the battery can be prevented. At this time, the SOC is equal to a fuel gauge on the battery pack of an electric vehicle or a hybrid vehicle.

Hereinafter, with reference to FIG. 1 and FIG. 2, embodiments of the present inventive concept will be described in detail.

Figure 1:
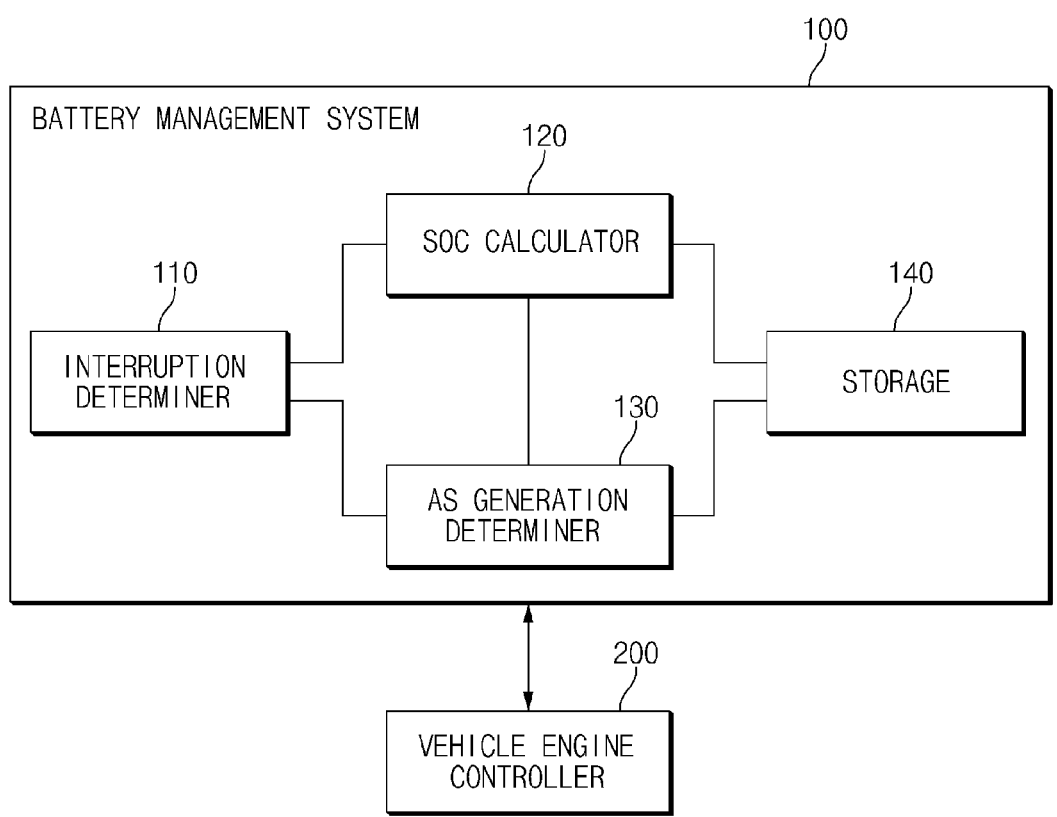
FIG. 1 is a configuration diagram showing a system for managing a battery according to an embodiment of the present inventive concept.

FIG. 1 is a configuration diagram showing a system for managing a battery according to an embodiment of the present inventive concept.

The battery management system (BMS) 100 according to an embodiment of the present inventive concept includes an interruption determiner 110, a SOC calculator 120, an After Sale Service (AS) generation determiner 130 and a storage 140.

The interruption determiner 110 determines whether the interruption of the battery voltage occurs. The interruption of the battery voltage means the state that the power source supplied to a vehicle engine controller 200 is temporally cut off due to an expected situation and so the power source of the vehicle engine controller 200 is turned off and turned on again. Like this, if the interruption suddenly occurs, the information required by the vehicle engine controller 200 such as the real SOC information, etc. is not stored in the storage 140. Because the real SOC of the battery and the SOC recognized by the battery management system 100 are not matched, a problem arises. Hence, the interruption determiner 110 determines that the interruption of the battery voltage occurs if the high voltage battery is detached in a latch section of the BMS after turning the ignition off or if the high voltage battery is detached in the state which the ignition is turned on.

The SOC calculator 120 calculates the SOC of the vehicle battery and stores the SOC to the storage 140. In particular, if the interruption determiner 110 determines that the interruption of the battery voltage occurs, the SOC calculator 120 resets the SOC of the battery. At this time, the calculation of the SOC can use a conventional method.

The AS generation determiner 130 determines whether the high voltage battery or the BMS is replaced due to the generation of the AS. That is, if the high voltage battery or the battery management system is replaced, the SOC is changed and the SOC stored in the storage 140 before the replacement can be misunderstood as the real SOC of the battery. Hence, as distinct from the interruption determiner 110, the AS generation determiner 130 can recognize the mismatch of the SOC due to the detachment of the high voltage battery or the BMS by the AS. The AS generation determiner 130 determines if the AS is performed in the state which an assistive battery is connected and if the AS is performed in the state which the assistive battery is detached.

That is, the AS generation determiner 130 determines that the AS is performed in the state which the assistive battery is connected if a soaking time is more than a predetermined time (for example, 10 minutes) and a hardware reset signal is received. Also, the AS generation determiner 130 determines that the AS is performed in the state which the assistive battery is detached if the soaking time is less than a predetermined time and the hardware reset signal is received. At this time, the AS may include the work replacing the BMS or the high voltage battery. Here, the hardware reset signal is received if the high voltage battery or the BMS is detached and it can be received from the device in the vehicle such as the vehicle engine controller 200 and the like. Also, the soaking time is the time that the ignition is maintained in the off state, and the soaking time is counted in the state which the assistive battery is maintained and the soaking time is not counted if the assistive battery is detached. For example, if the soaking time is more than 10 minutes, the assistive battery is the connected state, and if the soaking time is less than 10 minutes or is equal to 0, it can be determined that the assistive battery is detached. This information for the soaking time can be provided from the vehicle engine controller 200 (EMS).

Hence, the SOC calculator 120 resets the SOC of the battery if the AS generation determiner 130 determines as the AS state. At this time, the reset of the SOC is Open Circuit Voltage (OCV), that is, the battery voltage when there is no a load. The OCV voltage can be known after about 10 minutes after the current is applied to the battery by the polarization characteristic of the battery. Since the polarization characteristic becomes larger if the use amount of the current is larger, in the case of using a large amount of current, the OCV value of the battery voltage must be measured after a sufficient time lapses. Conventionally, the OCV value measured within 10 minutes after the battery current is used can have the difference value within 5% in comparison with the real SOC. Accordingly, in order to accurately calculate the SOC, the battery voltage must be measured after sufficiently waiting until the battery voltage becomes stable. Hence, the sufficient time may be the soaking time.

The storage 140 stores the SOC of the vehicle battery calculated from the SOC calculator 120 when the ignition is turned off and it can be implemented by an EEPROM.

In the normal state, after the ignition is turned on, the SOC stored in the storage 140 is called, and running of the vehicle is started by controlling the vehicle battery output. After that, if the ignition is turned off, a high voltage relay is turned off, and finally the calculated SOC is stored in the storage 140.

However, if the AS, such as the interruption of the battery voltage or the replacement of the component such as the BMS or the high voltage battery and the like, is generated, the SOC is not normally stored after turning the ignition off or the current SOC of the replaced high battery or battery management system does not match the SOC stored in the storage 140.

Accordingly, the present inventive concept determines the case that the real SOC is not matched with the SOC recognized by the battery management system due to the replacement of the component such as the BMS or the high voltage battery, and if the mismatched situation occurs, by resetting the SOC, the reset SOC is recognized as the SOC of the real battery.

For this, the present inventive concept determines the interruption of the battery voltage or the replacement of the BMS or the high voltage battery due to the generation of the AS and the like. That is, if the high voltage is detached in the latch section after the ignition, and the high voltage is detached in the ignition on section, if the AS is performed in the state which the assistive battery is connected, if the AS is performed in the state which the assistive battery is detached, the real SOC is matched with the SOC recognized by the battery management system by resetting the SOC.

Figure 2:
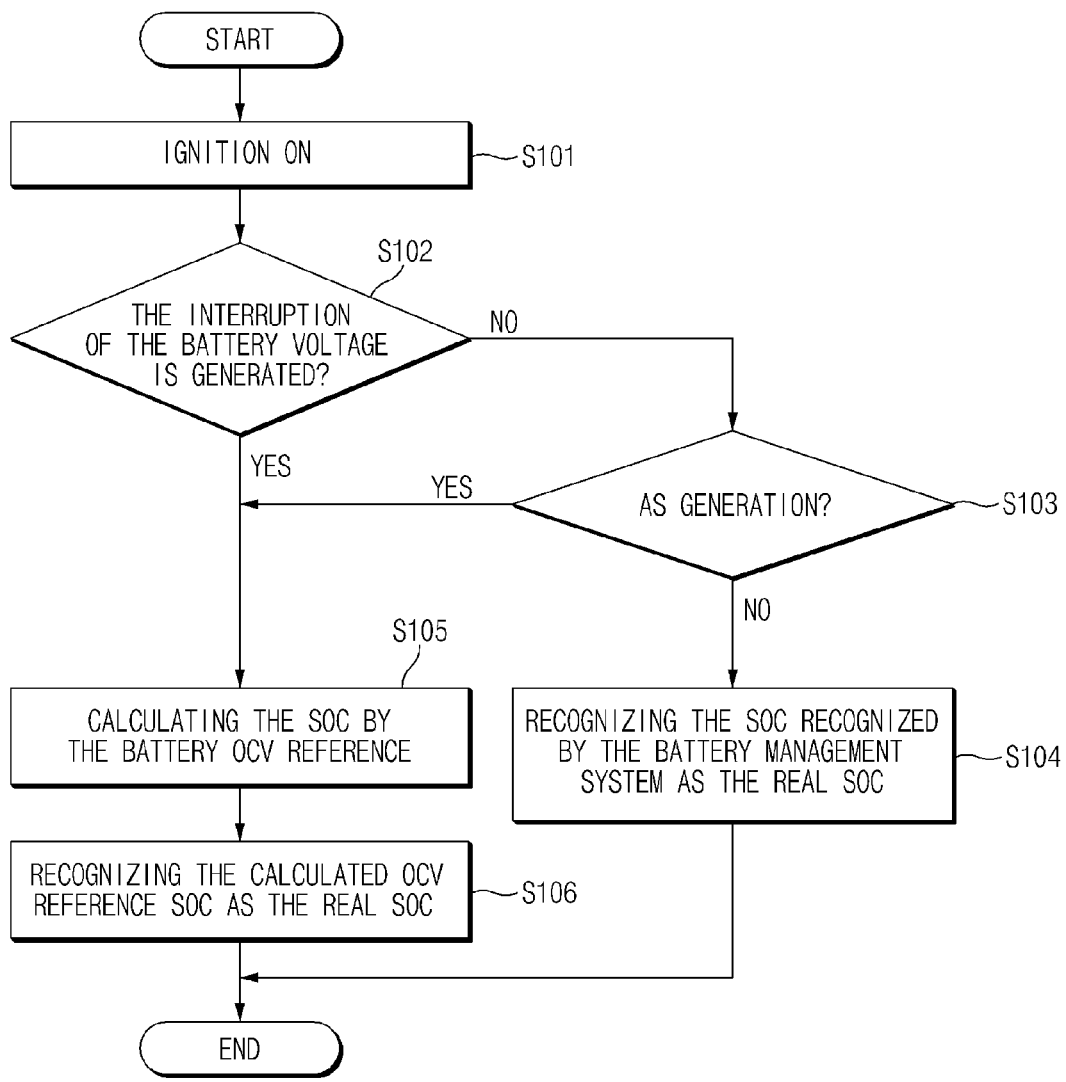
FIG. 2 is a flow chart showing a method for managing a battery according to an embodiment of the present inventive concept.

With reference to FIG. 2, a method for managing a battery according to an embodiment of the present inventive concept will be described in detail.

First, after the ignition is turned on (S101), the interruption determiner 110 determines whether the interruption of the battery voltage is generated (S102). At this time, the interruption determiner 110 determines that the interruption of the battery voltage is generated if the high voltage battery is detached in the latch section of the battery management system (BMS) after the ignition is turned off or if the high voltage battery is detached in the state which the ignition is turned on.

Hence, if the interruption determiner 110 determines that the interruption of the battery voltage is not generated, the AS generation determiner 130 determines whether the AS is performed (S103). At this time, the AS generation determiner 130 determines that the AS is performed in the state which the assistive battery is connected if the soaking time is more than a predetermined time and the hardware reset signal is received, and determines that the AS is performed in the state which the assistive battery is detached if the soaking time is less than a predetermined time and the hardware reset signal is received.

In the above step S103, if it is determined that the AS is not performed, it is determined as a normal state, and the SOC calculator 120 determines that the SOC calculated by the SOC calculator 120 is matched with the SOC stored in the storage 140 (S104).

In the above step S103, if it is determined that the AS is performed, or in the above step S102, if the interruption of the battery voltage is generated, the SOC calculator 120 calculates the SOC in the OCV state of the battery voltage (S105), and recognizes the SOC of the OCV reference as the real SOC of the battery (S106).

Like this, the present inventive concept calculates the SOC by the OCV reference and recognizes the SOC of the OCV reference as the real battery OCV if the interruption of the battery voltage is generated or the AS is performed by determining the interruption situation, the AS situation and the like.

Accordingly, the excessive use, etc. of the battery due to erroneous recognition of the SOC can be prevented and the battery can be optimally controlled by accurately recognizing the real SOC of the battery when the component such as the high voltage battery or the BMS and the like is replaced.

The preferred embodiment of the present inventive concept as the above described is for purposes of illustration, through the spirit and scope of the appended claims, various modifications, changes, substitutions and the addition, change, etc. can be made by the ordinary skilled in the art, and it is construed that the following claims includes these modifications, variations, etc.

What is claimed is:

1. A system for managing a battery comprising:
   an interruption determiner configured to determine an interruption of a vehicle battery voltage;
   an State Of Charge (SOC) calculator configured to calculate the SOC of the vehicle battery and reset the SOC if the interruption of the battery voltage occurs; and
   an After Sale Service (AS) generation determiner configured to determine whether the AS of a vehicle component is performed if the interruption of the battery voltage does not occur.

2. The system according to claim 1, wherein the SOC calculator recognizes a reset SOC as a real SOC of the battery by resetting the SOC if it is determined that the AS of the vehicle component is performed in the AS generation determiner, and recognizes an SOC last calculated in the SOC calculator as the real SOC of the battery if the AS of the vehicle component is not performed in the AS generation determiner.

3. The system according to claim 1, wherein the AS generation determiner determines that the AS is performed in a state which an assistive battery is connected and resets the SOC if a soaking time is more than a predetermined time and a hardware reset is recognized.

4. The system according to claim 1, wherein the AS generation determiner determines that the AS is performed in a state which an assistive battery is detached and resets the SOC if a soaking time is less than a predetermined time and a hardware reset is recognized.

5. The system according to claim 1, wherein the interruption determiner determines that the battery voltage is interrupted if a high voltage battery is detached in a latch section after an ignition is turned off, or if the high voltage battery is detached in a state which the ignition is turned on.

6. The system according to claim 1, wherein the AS includes a replacement of at least one component of a high voltage battery, a battery management system.

7. The system according to claim 1, further comprising a storage configured to store a calculated SOC of the vehicle battery.

8. A method for managing a battery comprising steps of:
   determining whether an interruption of a battery voltage occurs;
   determining whether an After Sale Service AS is performed, if the interruption of the battery voltage does not occur; and
   resetting a State Of Charge (SOC) of the battery if the AS is performed or the interruption of the battery voltage occurs; and
   recognizing the reset SOC as a real SOC of the battery.

9. The method according to claim 8, wherein the step of determining whether a AS is performed determines that the AS is performed in a state which an assistive battery is connected if a soaking time is more than a predetermined time and a hardware reset is recognized.

10. The method according to claim 8, wherein the step of determining whether an AS is performed determines that the AS is performed in a state which an assistive battery is detached if a soaking time is less than a predetermined time and a hardware reset is recognized.

11. The method according to claim 8, wherein the step of determining determines that the battery voltage is interrupted if a high voltage battery is detached in a latch section after an ignition is turned off, or if the high voltage battery is detached in a state which the ignition is turned on.

* * * * *